United States Patent [19]
Smith et al.

[11] Patent Number: 6,094,035
[45] Date of Patent: Jul. 25, 2000

[54] AMPLIFYING POWER CONVERTER CIRCUITS

[75] Inventors: Douglas L. Smith; Robert St. Pierre, both of Tucson, Ariz.

[73] Assignee: Gain Technology Corporation, Tucson, Ariz.

[21] Appl. No.: 09/378,663

[22] Filed: Aug. 20, 1999

[51] Int. Cl.[7] .................................. G05F 1/10; G05F 1/40
[52] U.S. Cl. ............................................ 323/222; 323/282
[58] Field of Search ..................................... 323/220, 222, 323/223, 226, 270, 271, 273, 282

[56] References Cited

U.S. PATENT DOCUMENTS

| | | |
|---|---|---|
| 4,316,243 | 2/1982 | Archer . |
| 4,536,696 | 8/1985 | Ray . |
| 4,713,742 | 12/1987 | Parsley . |
| 4,821,163 | 4/1989 | Bloom . |
| 4,975,819 | 12/1990 | Lannuzel . |
| 5,235,504 | 8/1993 | Sood . |
| 5,253,157 | 10/1993 | Severinsky . |
| 5,270,636 | 12/1993 | Lafferty ................................. 323/222 |
| 5,287,261 | 2/1994 | Ehsani ................................... 363/124 |
| 5,513,094 | 4/1996 | Stanley . |
| 5,572,113 | 11/1996 | Barrett . |
| 5,657,219 | 8/1997 | Stanley . |
| 5,668,464 | 9/1997 | Krein et al. . |
| 5,714,863 | 2/1998 | Hwang et al. . |
| 5,734,258 | 3/1998 | Esser . |
| 5,932,995 | 8/1999 | Wagoner ................................ 323/222 |

*Primary Examiner*—Matthew Nguyen
*Attorney, Agent, or Firm*—Hickman Stephens Coleman & Hughes, LLP

[57] ABSTRACT

A plurality of amplifying power converter circuits are provided each including a pair of switches being connected between two constant voltage sources and an output node common to each of the switches. Such output node is adapted for connection to a load. Also included is a modulator that serves for opening and closing one of the switches with a first duty cycle and opening and closing another one of the switches with a second duty cycle. The first duty cycle and the second duty cycle are at least partially "overlapped". During modulation, the power converter has a voltage gain at the output node that is greater than unity and exhibits improved distortion characteristics.

43 Claims, 7 Drawing Sheets

$D_{C1} = T - (T_A + T_B + T_C)$
$D_{C2} = T - (T_B)$
$\Delta D = - (T_A - T_C)$

AMPLIFYING POWER CONVERTER CIRCUITS

DESCRIPTION

1. Technical Field

The present invention relates to switching power converters and more particularly pertains to a plurality of new amplifying power converter circuits for providing improved distortion characteristics while potentially delivering a greater than unity gain.

2. Background Art

Figure 1:
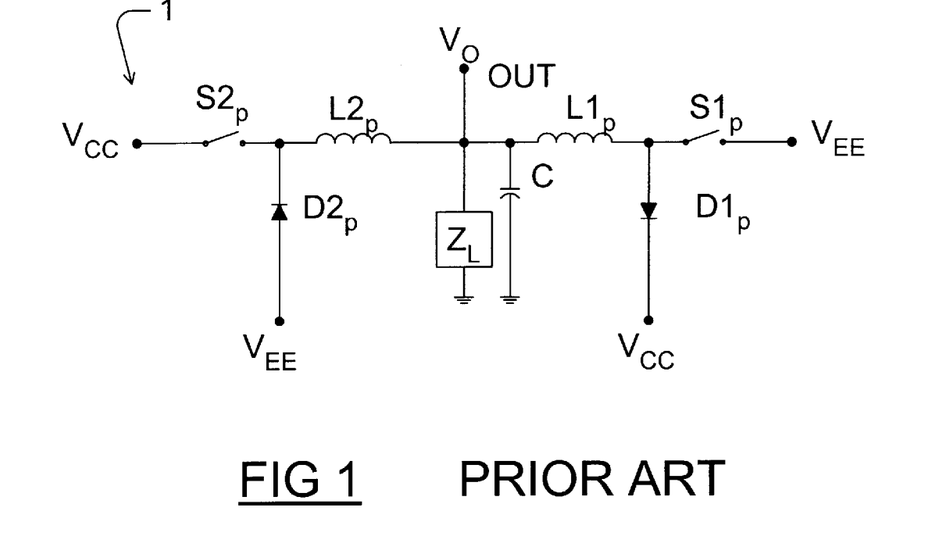
FIG. 1 is a schematic diagram of a switching power converter of the prior art with less than unity gain.

Switching power converters are common electrical devices that may be used to convert direct current to alternating current for various purposes. One example of a switching power converter 1 of the prior art is shown in FIG. 1. Such switching power converter 1 includes a pair of switches $S1_P$ and $S2_P$, a pair of one way conductors $D1_P$ and $D2_P$, a pair of inductors $L1_P$ and $L2_P$, and an output node OUT each interconnected as shown between constant positive and negative voltage sources VCC and VEE.

During use of the switching power converter 1, the switches $S1_P$ and $S2_P$ are opened and closed independently by switch control signals to produce an output signal at the output node OUT. In use, small time gaps, or pauses, are sometimes placed between the actuation of the switches $S1_P$ and $S2_P$. This procedure is referred to as "underlap". In other situations, the switches $S1_P$ and $S2_P$ of the switching power converter 1 may be deliberately actuated together in a scenario referred to as "overlap". Benefits accrued during "overlap" operation include the ability to accommodate brief demands that exceed the converter power rating. Additional details regarding operation of switching power converters like the one shown in FIG. 1 can be found in U.S. Pat. No. 5,657,219 issued to Stanley which is incorporated herein by reference in its entirety.

Up to now, the implementation of "underlap" and "overlap" operation has been limited to only certain switching power converter topologies like that shown in FIG. 1 for the specific purposes of increasing fidelity by improving distortion characteristics and accommodating brief demands that exceed a converter power rating. There has not, however, been any implementation of "underlap" and "overlap" operation in the switching power converter arts for the purpose of achieving greater than unity gains similar to that of an amplifier.

SUMMARY OF THE INVENTION

The present invention includes a plurality of circuits topologies which exhibit voltage gains that are capable of exceeding unity while maintaining many of the advantages of switching power converters, i.e. decreased distortion and increased efficiency. Such criteria are particularly beneficial in low power applications since the output signal is capable of obtaining levels greater than the voltage sources VCC and VEE.

To attain this, the present invention includes a plurality of amplifying power converter circuits each including two or more independently controlled switches and two or more free wheeling diodes used to connect the output node to one or both of a pair of constant voltage sources. Such output node is adapted for connection to a load. Also included is a modulator that serves for opening and closing one of the switches with a first duty cycle (DC1) and opening and closing another one of the switches with a second duty cycle (DC2). The resulting gain is dependent on the circuit topology chosen, the first duty cycle (DC1), the second duty cycle (DC2), and the "overlapped" time. During modulation, the power converter can potentially have a voltage gain at the output node that is greater than unity, thereby operating as an amplifier.

In these respects, the present invention provides an amplifying power converter that maintains the benefits of switching power converters which are not existent in conventional types of amplifiers. In particular, the amplifying power converter of the present invention exhibits an inherent higher efficiency and improved distortion characteristics.

BRIEF DESCRIPTION OF THE DRAWINGS

The invention will be better understood when consideration is given to the following detailed description thereof. Such description makes reference to the annexed drawings wherein.

DISCLOSURE OF THE INVENTION

Figure 2:
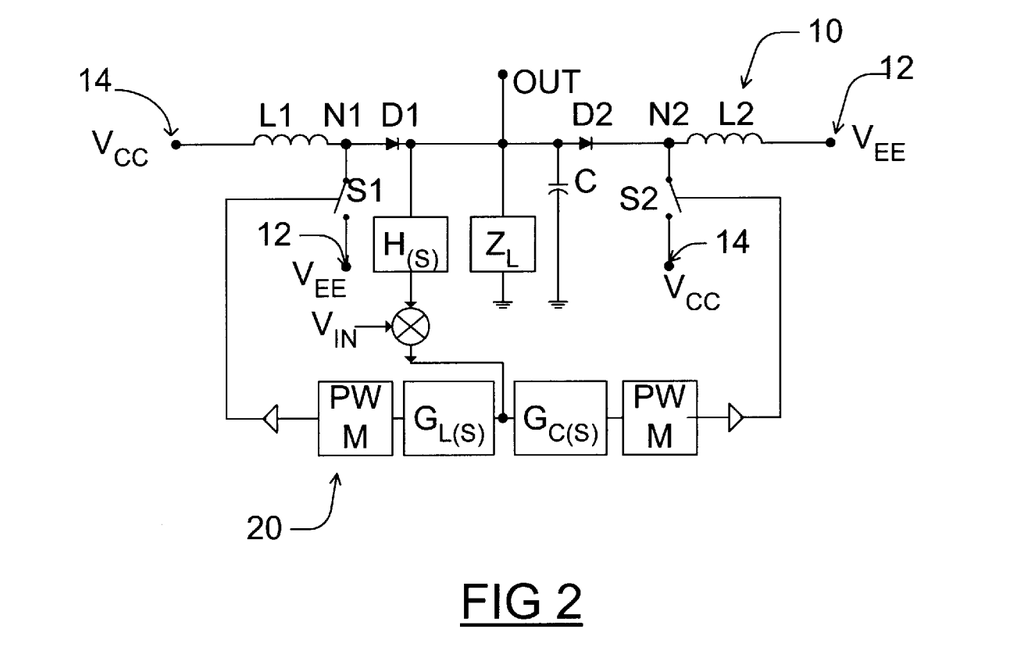
FIG. 2 is a schematic diagram of a first power converter of the present invention shown in one possible application.
Figure 3:
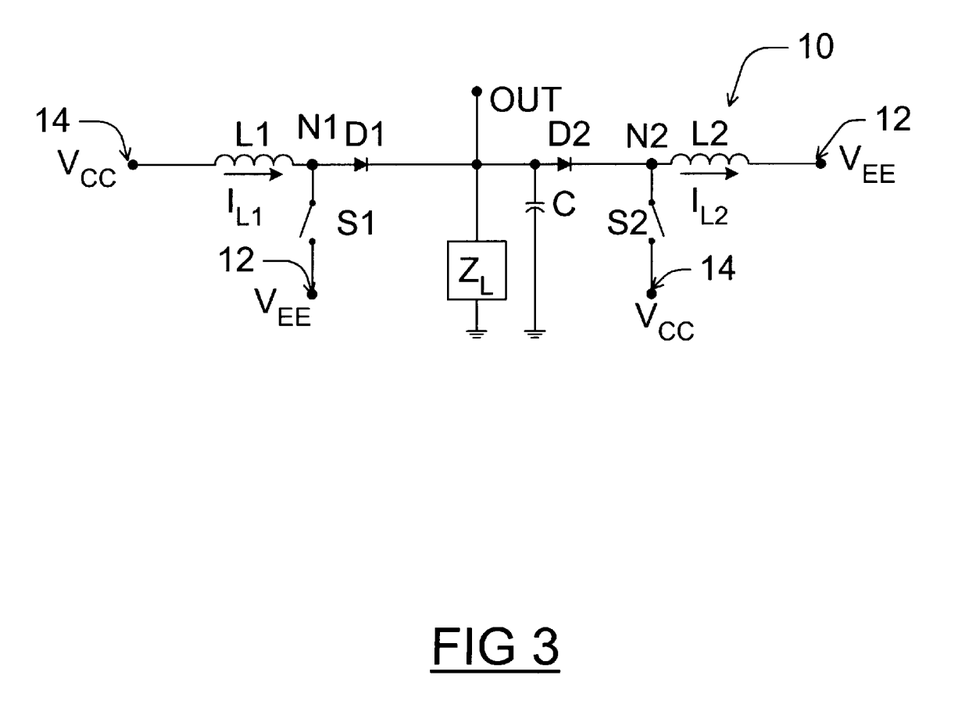
FIG. 3 is a schematic diagram of the amplifying power converter of FIG. 2.

FIG. 1 illustrates the prior art. With reference to FIGS. 2 and 3, a power converter 10 of the present invention, the "Boost Derived" power converter, includes a pair of switches S1 and S2, a pair of one way conductors D1 and D2, a pair of inductors L1 and L2, and an output node OUT. The first switch S1 is connected between the output node OUT, or more particularly a first intermediate node N1, and the negative voltage source VEE via a negative voltage node 12. It should be noted that the negative voltage node could be connected to ground for single supply applications. Similarly, the second switch S2 is connected between the output node OUT, or more particularly a second intermediate node N2, and the positive voltage source VCC via a positive voltage node 14.

With continuing reference to FIGS. 2 and 3, the first one way conductor D1 is connected between the first switch S1 and the output node OUT for allowing current to only flow to the output node OUT. Similarly, the second one way conductor D2 is connected between the second switch S2 and the output node OUT for allowing current to only flow from the output node OUT. The first inductor L1 is connected between the positive voltage source VCC and the first switch S1. The second inductor L2 is connected between the negative voltage source VEE and the second switch S2.

A modulator 20 is provided for opening and closing the switches S1 and S2. It should be noted that any type of modulator 20 may be used in combination with the present invention. In alternate embodiments, the modulator of FIG. 2 may be modified per the desires of the user. Further, instead of using a pulse width modulator (PWM) with a fixed frequency, the input frequency can be used in order to simplify the modulator circuitry.

Figure 4:
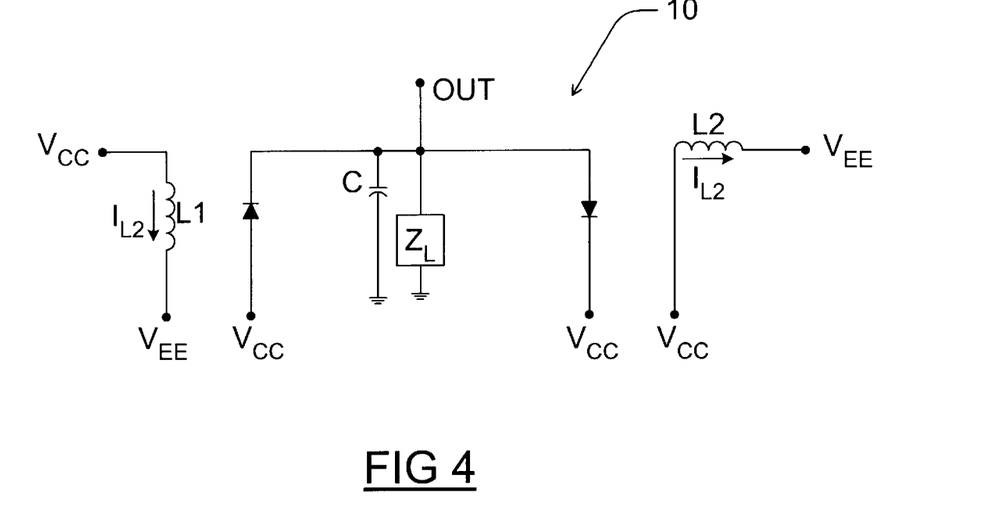
FIG. 4 is a schematic diagram of the amplifying power converter of FIG. 2 when both switches are closed simultaneously.
Figure 5:
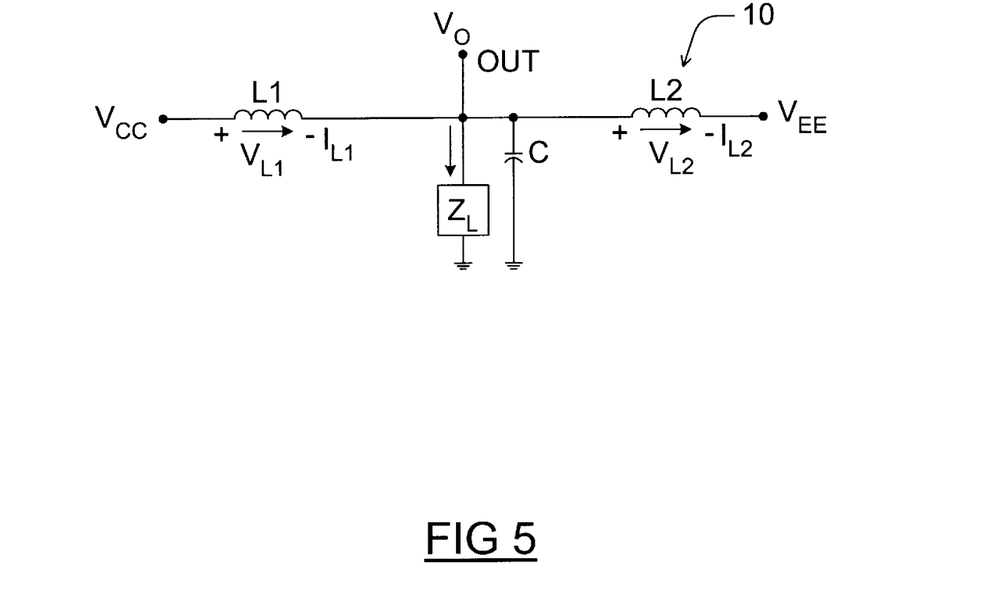
FIG. 5 is a schematic diagram of the amplifying power converter of FIG. 2 when both switches are opened simultaneously.

Before the operation of the modulator can be effectively described, it is necessary to provide information relating to the various phases of the power converter 10 during use. As indicated earlier, the switches S1 and S2 are open and closed by the modulator 20. Two examples of how the switches S1 and S2 may be opened or closed are shown in FIGS. 4 and 5. FIG. 4 shows a first phase wherein the switches S1 and S2 are both closed, thus rendering the resulting delineated circuit. During the first phase, inductor currents $I_{L1}$ and $I_{L2}$ across the inductors L1 and L2 each increase linearly as a function of time that the corresponding switch is closed and voltage is applied. Upon the simultaneous opening of the switches S1 and S2, a second phase is afforded which renders the resulting circuit of FIG. 5. In the second phase, the inductor currents $I_{L1}$ and $I_{L2}$ in the inductors can not change instantaneously. Therefore, the diodes forward bias and the inductor currents $I_{L1}$ and $I_{L2}$ in the inductors are applied to the load $Z_L$, thereby affording an output voltage $V_O$ at the output node OUT. The currents at the output node OUT can be summed as follows: $I_{L1}-V_O/Z_L-I_{L2}=0$. Consequently, the output voltage $V_O$ may be calculated as $V_O=(I_{L1}-I_{L2})/Z_L$. It should be noted that the output voltage $V_O$ may exceed the magnitude of the voltage sources VCC and VEE. It should be noted that if L1=L2 and the duty cycles of S1 and S2 are equal, $V_O=0$.

As such, it becomes apparent that the inductor currents $I_{L1}$ and $I_{L2}$ each increase as a function of the time that the corresponding switch is closed, or actuated, and the output voltage $V_O$ increases or decreases as a function of the difference between the inductor currents $I_{L1}$ and $I_{L2}$. Therefore, it follows that the output voltage $V_O$ is a function of the difference in duration that the switches are simultaneously closed or, in other words, the difference or "overlap" in the duty cycles $\Delta D=D_1-D_2$ of modulation of the switches S1 and S2.

In the case of the power converter 10 of FIGS. 2 and 3, the various components are specifically configured to render a voltage gain equation of $V_{O/VIN}=1/(1-\Delta D)$. Therefore, given a non-zero difference in duty cycles $D_1$ and $D_2$ of the pair of switches S1 and S2, the specific topology of the power converter 10 is capable of rendering a voltage gain $V_O/V_{IN}$ that is greater than unity.

Figure 6:
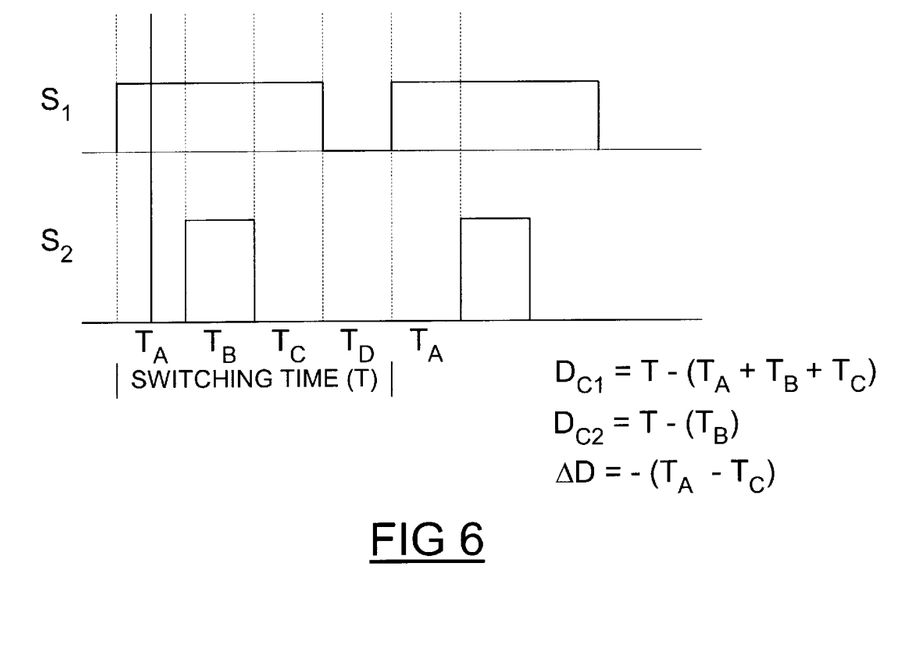
FIG. 6 is a timing diagram depicting switch control signals which "overlap" and have different duty cycles which, in turn, affords greater than unity gains when implemented on the amplifying power converter of FIG. 2.
Figure 7:
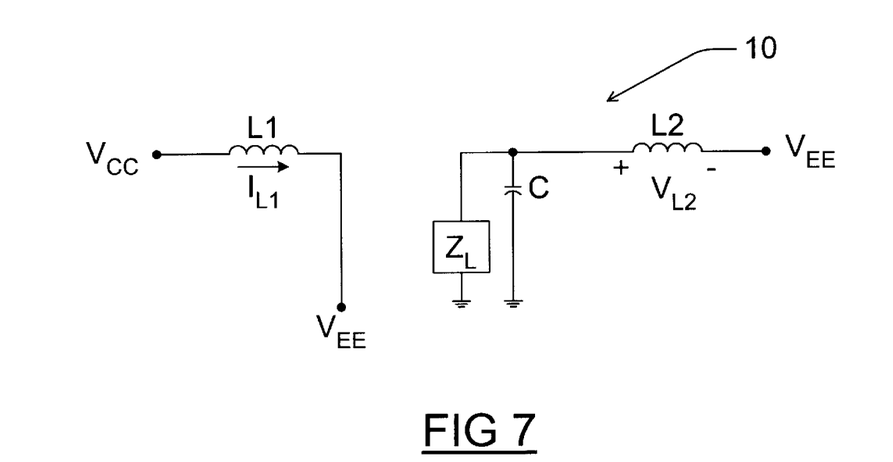
FIG. 7 is a schematic diagram of the amplifying power converter of FIG. 2 when one switch is closed and another switch is open, as in the case when the switch control signals "overlap" and have different duty cycles.

For example, a control scheme may be employed as shown in FIG. 6 wherein the duty cycle $D_1$ of the first switch S1 exceeds the duty cycle $D_2$ of the second switch S2. In this case, the power converter 10 operates in the first phase for a time period $T_B$ and further operates in the second phase for a time period $T_D$. During time periods $T_A$ and $T_C$, however, one of the inductor currents $I_{L1}$ continually increases for a time greater than that in which the inductor current $I_{L2}$ increases. This results in a positive $V_O$. It should be noted that the inductor current $I_{L2}$ could just as easily be increased for an amount of time greater with respect to that of the inductor current $I_{L1}$, resulting in a negative $V_O$.

While the general operation and use of the present invention has been set forth, various other parameters rmay be altered to vary the nature of the operability of the present invention. One example of such alterations is to operate the present invention in a continues conduction mode (CCM), current controlled mode, or a discontinuous conduction mode (DCM). The main benefit associated with such operation is that the transfer function of the present invention is simplified. This is accomplished by reducing the number of poles in the control to output transfer function.

Such simplification, in turn, makes frequency compensation easier during closed loop operation. Unlike the prior art power converter of FIG. 1, the transfer function of the present invention does not exhibit inherent linearity with a changing duty cycle. To carry out DCM operation and compensate for such deficiency, a dimensionless boundary expression K must be calculated based on the load impedance $Z_L$, inductance L, and switching period $T_S$. For the power converter 10 of FIGS. 2 and 3, K can be calculated as follows: $K=2*L/(R*T_S)$. Next, another dimensionless boundary expression $K_{CRIT}$ must be calculated based on the duty cycles $D_1$ and $D_2$ of the switches S1 and S2. For the power converter 10, $K_{CRIT}$ can be calculated as follows: $K_{CRIT}=\Delta(1-\Delta D)^2$. Given the expressions K and $K_{CRIT}$, the duty cycles $D_1$ and $D_2$ of the switches must be selected in order that the inequality $K<K_{CRIT}$ holds true. In the alternative, the load impedance $Z_L$, inductance L, and switching period $T_S$ may also be manipulated to ensure that the inequality $K<K_{CRIT}$ is upheld. For more information on operating circuits in DCM, reference may be made to Fundamentals of Power Electronics by Robert W. Erickson which is incorporated herein by reference in its entirety.

In the remaining power converters of the present invention that are shown in FIGS. 8–11, all of the benefits of the previous power converter 10 of FIGS. 2 and 3 are accrued with a difference being the exact voltage gain $V_O/V_{IN}$ that is afforded and/or the specific circuit topology that is employed to achieve such desired voltage gain $V_O/V_{IN}$. Use of the following power converters of FIGS. 8–11 parallels that of the power converter 10 of FIGS. 2 and 3, as set forth hereinabove.

Figure 8:
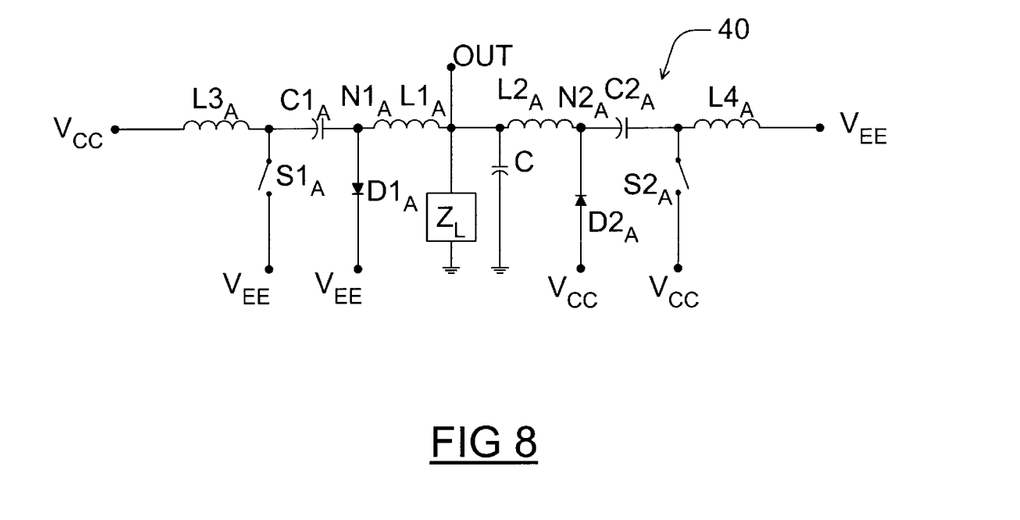
FIG. 8 is a schematic diagram of a second amplifying power converter of the present invention.

As shown in FIG. 8, another power converter 40 of the present invention, the "Cuk Derived" power converter, is set forth. The power converter 40 of FIG. 8 includes a pair of switches $S1_A$ and $S2_A$; a pair of one way conductors $D_1A$ and $D^2A$; a pair of capacitors $C1_A$ and $C2_A$; a plurality of inductors $L1_A$, $L2_A$, $L3_A$, and $L4_A$; and an output node OUT. The first switch $S1_A$ is connected to the negative voltage source VEE. Similarly, the second switch S2 is connected to the positive voltage source VCC. The first one way conductor $D1_A$ is connected between the negative voltage source VEE and a first intermediate node $N1_A$. As shown in FIG. 8, such first intermediate node $N1_A$ is situated between the first switch $S1_A$ and the output node OUT. In operation, the first one way conductor $D1_A$ of the power converter 40 serves for allowing current to only flow from the output node OUT. For allowing current to only flow to the output node OUT, the second one way conductor $D2_A$ is connected between the positive voltage source VCC and a second intermediate node $N2_A$. As shown, such second intermediate node $N2_A$ is positioned between the second switch $S2_A$ and the output node OUT.

The first inductor $L1_A$ of the power converter 40 of FIG. 8 is connected between the first intermediate node $N1_A$ and the output node OUT. The second inductor $L2_A$ is connected between the second intermediate node $N2_A$ and the output node OUT. The third inductor $L3_A$ is connected between the positive voltage source VCC and the first switch $S1_A$ while the fourth inductor $L4_A$ is connected between the negative voltage source VEE and the second switch $S2_A$. The capacitors $C1_A$ and $C2_A$ of the power converter 40 include a first capacitor $C1_A$ connected between the first intermediate node $N1_A$ and the first switch $S1_A$ and a second capacitor $C2_A$ connected between the second intermediate node $N2_A$ and the second switch $S2_A$. Together, the foregoing components work in conjunction to render a voltage gain of $V_O/V_{IN}=-\Delta D/(1-\Delta D)$. This inverting, or negative, voltage gain is particularly beneficial when assisting with "pole-split" style frequency compensation. For the power converter 40 of FIG. 8 to be used during DCM operation, the necessary expression K may be calculated as follows: $K=2*L/(R*T_S)$.

Figure 9:
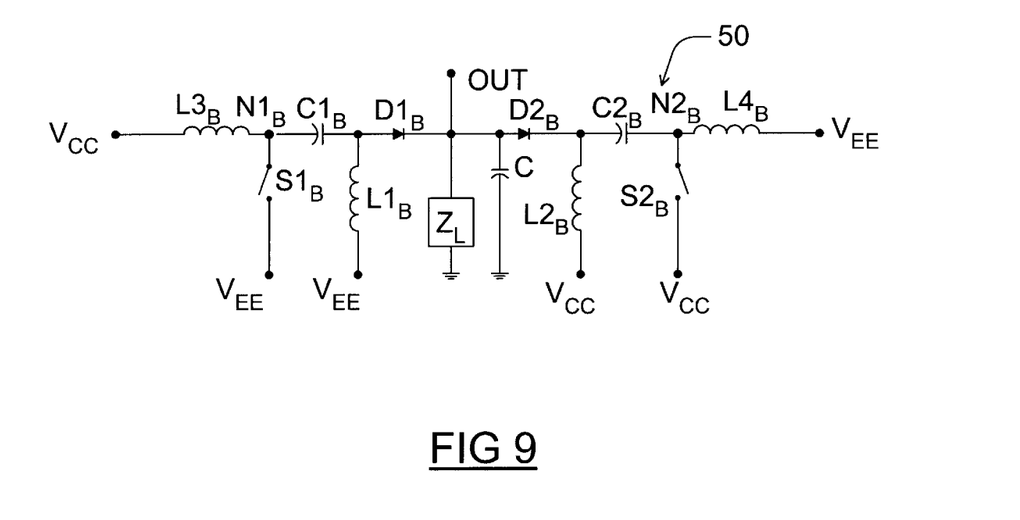
FIG. 9 is a schematic diagram of a third amplifying power converter of the present invention.

Yet another power converter 50 of the present invention, the "Sepic Derived" power converter, is shown in FIG. 9. The power converter 50 includes a pair of switches $S1_B$ and $S2_B$; a pair of one way conductors $D1_B$ and $D2_B$; a pair of capacitors $C1_B$ and $C2_B$; a plurality of inductors $L1_B$, $L2_B$, $L3_B$, and $L4_B$; and an output node OUT. The first switch $S1_B$ is connected between the output node OUT, or more particularly a first intermediate node $N1_B$, and the negative voltage source VEE. Similarly, the second switch $S2_B$ is connected between the output node OUT, or more particularly a second intermediate node $N2_B$, and the positive voltage source VCC. With respect to the one way conductors $D1_B$ and $D2_B$, the first one way conductor $D1_B$ is connected between the first switch $S1_B$ and the output node OUT for allowing current to only flow to the output node OUT. Similarly, the second one way conductor $D2_B$ is connected between the second switch $S2_B$ and the output node OUT for allowing current to only flow from the output node OUT.

With continuing reference to FIG. 9, the inductors $L1_B$, $L2_B$, $L3_B$ and $L4_B$ of the power converter 50 include a first inductor $L1_B$ connected between the first one way conductor $D1_B$ and the negative voltage source VEE and a second inductor $L2_B$ connected between the second one way conductor $D2_B$ and the positive voltage source VCC. Also provided is a third inductor $L3_B$ connected between the positive voltage source VCC and the first switch $S1_B$ and a fourth inductor $L4_B$ connected between the negative voltage source VEE and the second switch $S2_B$.

The capacitors $C1_B$ and $C2_B$ of power converter 50 of FIG. 9 include a first capacitor that is connected between the first switch $S1_B$ and the first inductor $L1_B$. Further, the second capacitor $C2_B$ is connected between the second switch $S2_B$ and the second inductor $L2_B$. In use, the foregoing components of the power converter 50 render a voltage gain of $V_O/V_{IN}=\Delta D/(1-\Delta D)$. For the power converter 50 of FIG. 9 to be used during DCM operation, the necessary expression K may be calculated as follows: $K=2*L/(R*T_S)$.

Figure 10:
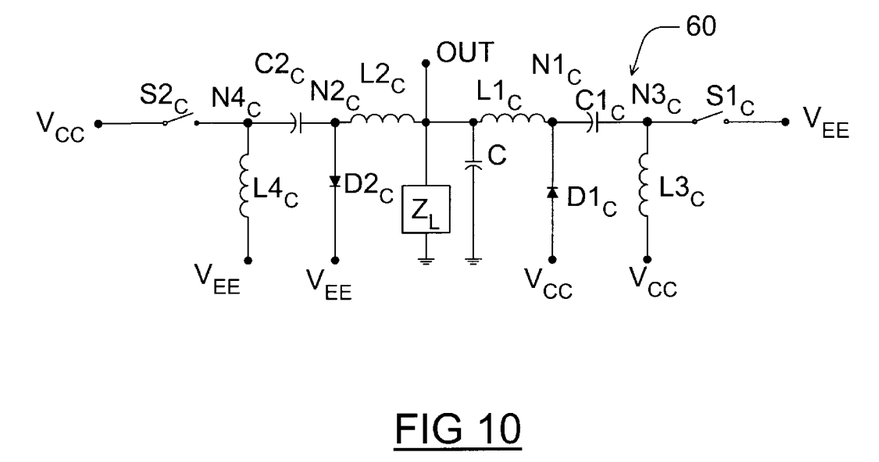
FIG. 10 is a schematic diagram of a fourth amplifying power converter of the present invention.

Still yet another power converter 60 of the present invention, the "Inverse of Sepic Derived" power converter, is shown in FIG. 10. Such power converter 60 includes a pair of switches $S1_C$ and $S2_C$; a pair of one way conductors $D1_C$ and $D2_C$; a pair of capacitors $C1_C$ and $C2_C$; a plurality of inductors $L1_C$, $L2_C$, $L3_C$, and $L4_C$; and an output node OUT. The first switch $S1_C$ is connected between the output node OUT, or more particularly an intermediate node $N3_C$, and the negative voltage source VEE. Similarly, the second switch $S2_C$ is connected between the output node OUT, or more particularly an intermediate node $N4_C$, and the positive voltage source VCC. The first one way conductor $D1_C$ is connected between the positive voltage source VCC and a first intermediate node $N1_C$ between the first switch $S1_C$ and the output node OUT. In operation, the first one way conductor $D1_C$ is adapted for allowing current to only flow to the output node OUT. Associated therewith is the second one way conductor $D2_C$ which is connected between the negative voltage source VEE and a second intermediate node $N2_C$. The second intermediate node $N2_C$ is positioned between the second switch $S2_C$ and the output node OUT. In use, the second one way conductor $D2_C$ is adapted for allowing current to only flow from the output node OUT.

With continuing reference to FIG. 10, the first inductor $L1_C$ of the power converter 60 is connected between the first intermediate node $N1_C$ and the output node OUT. Connected between the second intermediate node $N2_C$ and the output node OUT is a second inductor $L2_C$. Further, the third inductor $L3_C$ is connected between the positive voltage source VCC and the first switch $S1_C$ while the fourth inductor $L4_C$ is connected between the negative voltage source VEE and the second switch $S2_C$. Lastly, the first capacitor $C1_C$ of the power converter 60 is connected between the first intermediate node $N1_C$ and the first switch $S1_C$. Further, the second capacitor $C2_C$ is connected between the second intermediate node $N2_C$ and the second switch $S2_C$. In use, the specific interconnection of components of the power converter 60 renders a voltage gain of $V_O/V_{IN}=\Delta D/(1-\Delta D)$. It should be noted that the power converters of FIGS. 8–10 each exhibit lower ripple which affords easier output noise filtering and improves distortion characteristics. For the power converter 60 of FIG. 10 to be used during DCM operation, the necessary expression K may be calculated as follows: $K=2*L/(R*T_S)$. It should be noted that it would be well within the ability of one of ordinary skill to calculate the value of $K_{CRIT}$.

Figure 11:
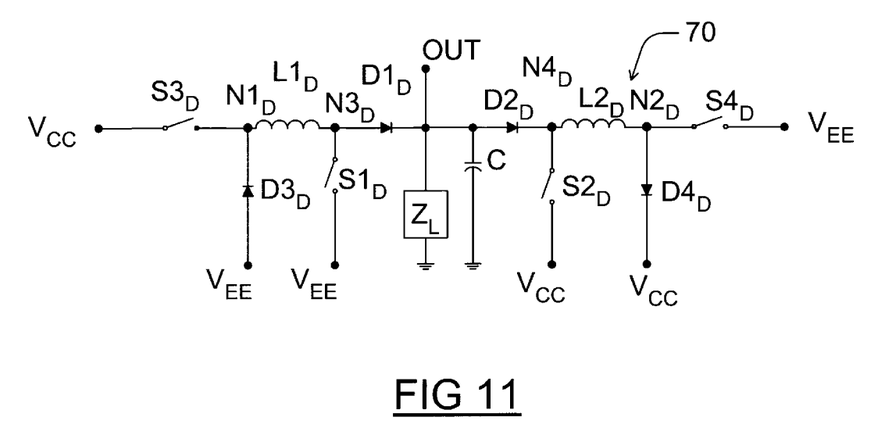
FIG. 11 is a schematic diagram of a fifth amplifying power converter of the present invention.

Another power converter 70, the "Non-inverting Buck Boost Derived" power converter, is shown in FIG. 11. The power converter 70 a includes a plurality of switches $S1_D$, $S2_D$, $S3_D$, and $S4_D$; a plurality of one way conductors $D1_D$, $D2_D$, $D3_D$, and $D4_D$; a pair of inductors $L1_D$ and $L2_D$; and an output node OUT. The first switch $S1_D$ is connected between the output node OUT, or more particularly an intermediate node $N3_D$, and the negative voltage source VEE. Similarly, the second switch $S2_D$ is connected between the output node OUT, or more particularly an intermediate node $N4_D$, and the positive voltage source VCC. With continuing reference to FIG. 11, the first one way conductor $D1_D$ is connected between the first switch $S1_D$ and the output node OUT for allowing current to only flow to the output node OUT. Similarly, the second one way conductor $D2_D$ is connected between the second switch $S2_D$ and the output node OUT for allowing current to only flow from the output node OUT. The first inductor $L1_D$ is connected between the positive voltage source VCC, or more particularly the first intermediate node $N1_D$, and the first switch $S1_D$. The second inductor $L2_D$ is connected between the negative voltage source VEE, or more particularly the second intermediate node $N2_D$, and the second switch $S2_D$.

With continuing reference to FIG. 11, the power converter 70 is shown to differ from the power converter 10 of FIG. 1 by the inclusion of the switches $S3_D$ and $S4_D$ and the one way conductors $D3_D$ and $D4_D$. The third one way conductor $D3_D$ of the power converter 70 is connected between the negative voltage source VEE and a first intermediate node $N1_D$. Such first intermediate node $N1_D$ is situated between the first inductor $L1_D$ and the positive voltage source VCC. Similarly, the fourth one way conductor $D4_D$ is connected between the positive voltage source VCC and a second intermediate node $N2_D$ between the second inductor $L2_D$ and the negative voltage source VEE. With respect to the additional switches of the power converter 70, the third switch $S3_D$ is connected between the first intermediate node $N1_D$ and the positive voltage source VCC. The fourth switch $S4_D$ is connected between the second intermediate node $N2_D$ and the negative voltage source VEE. In operation, the third and fourth switch $S3_D$, $S4_D$ are adapted for being opened and closed coincidentally while the first and second switch $S1_D$, $S2_D$ are together being closed and opened, respectively.

For the power converter 70 of FIG. 11 to be used during DCM operation, the necessary expression K may be calculated as follows: $K=2*L/(R*T_S)$. It should be noted that it would be well within the ability of one of ordinary skill to calculate the value of $K_{CRIT}$.

Figure 12:
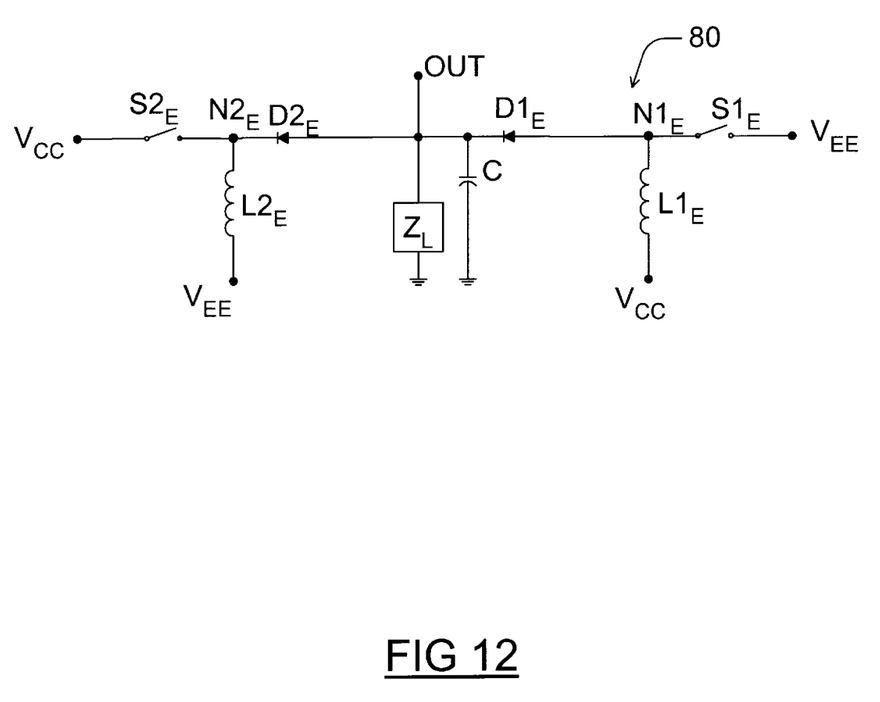
FIG. 12 is a schematic diagram of a sixth amplifying power converter of the present invention.

With reference now to FIG. 12, a sixth power converter 80 of the present invention, the "Buck-Boost Derived" power converter, includes a pair of switches $S1_E$ and $S2_E$, a pair of one way conductors $D1_E$ and $D1_E$, a pair of inductors $L1_E$ and $L2_E$, and an output node OUT. The first switch $S1_E$ is connected between the output node OUT, or more particularly a first intermediate node $N1_E$, and the negative voltage source VEE via a negative voltage node. Similarly, the second switch $S2_E$ is connected between the output node OUT, or more particularly a second intermediate node $N2_E$, and the positive voltage source VCC via a positive voltage node.

With continuing reference to FIG. 12, the first one way conductor $D1_E$ is connected between the first switch $S1_E$ and the output node OUT for allowing current to only flow to the output node OUT. Similarly, the second one way conductor $D2_E$ is connected between the second switch $S2_E$ and the output node OUT for allowing current to only flow from the output node OUT. The first inductor $L1_E$ is connected between the positive voltage source VCC and the first switch $S1_E$. The second inductor $L2_E$ is connected between the negative voltage source VEE and the second switch $S2_E$.

For the power converter 80 of FIG. 12 to be used during DCM operation, the necessary expression K may be calculated as follows: $K=2*L/(R*T_S)$. It would be well within the ability of one of ordinary skill to calculate the value of $K_{CRIT}$.

It should be noted that in the case of each of the foregoing power converters, the various electrical components may vary insofar as the objectives of the present invention are still met. For example, the one way conductors may take the form of any electrical component for allowing current to flow in a single direction when desired. To accomplish this, any sort of diode including a Schottky diode may be employed. For that matter, the diodes may even be replaced with switches which carry out a similar function. The various modulated switches may also take on various forms including, but not limited to MOS switches, "quasi resonant" switches which can improve efficiency when properly chosen. With respect to the load $Z_L$, the same may consist of any type of impedance whether it be capacitive, inductive, or resistive. Further, while the circuit topologies of the present invention are capable of exceeding unity gain, it should be recognized that in alternate embodiments of the present invention, gain may be selected to be less than one. Finally, each of the various circuit topologies may include a storage element in the form of a capacitor C which remains in parallel with the load impedance.

Although only a few embodiments of the present invention have been described in detail herein, it should be understood that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope of the appended claims.

We claim:

1. An amplifying power converter comprising:
   a pair of switches being adapted for being connected between two constant voltage sources or between a positive voltage source and ground;
   an output node common to each of the switches, said output node adapted for being connected to a load; and
   a modulator for opening and closing one of the switches with a first duty cycle and opening and closing another one of the switches with a second duty cycle, wherein the first duty cycle and the second duty cycle at least partially overlap;
   wherein during the opening and closing of the switches, the power converter has a voltage gain at the output node that is greater than unity.

2. The power converter as set forth in claim 1, wherein the constant voltage sources include a positive voltage source and a negative voltage source, a first one of the switches being connected between the negative voltage source and the output node and a second one of the switches being connected between the positive voltage source and the output node.

3. The power converter as set forth in claim 2, wherein a first one way conductor is connected between the first switch and the output node for allowing current to only flow to the output node and a second one way conductor is connected between the second switch and the output node for allowing current to only flow from the output node.

4. The power converter as set forth in claim 3, wherein a first inductor is connected between the positive voltage source and the first switch and a second inductor is connected between the negative voltage source and the second switch.

5. The power converter as set forth in claim 2, wherein a first one way conductor is connected between the negative voltage source and a first intermediate node between the first switch and the output node for allowing current to only flow from the output node and a second one way conductor is connected between the positive voltage source and a second intermediate node between the second switch and the output node for allowing current to only flow to the output node.

6. The power converter as set forth in claim 5, wherein a first inductor is connected between the first intermediate node and the output node and a second inductor is connected between the second intermediate node and the output node.

7. The power converter as set forth in claim 6, wherein a third inductor is connected between the positive voltage source and the first switch and a fourth inductor is connected between the negative voltage source and the second switch.

8. The power converter as set forth in claim 7, wherein a first capacitor is connected between the first intermediate node and the first switch and a second capacitor is connected between the second intermediate node and the second switch.

9. The power converter as set forth in claim 3, wherein a first inductor is connected between the first one way conductor and the negative voltage source and a second inductor is connected between the second one way conductor and the positive voltage source.

10. The power converter as set forth in claim 9, wherein a first capacitor is connected between the first switch and the first inductor and a second capacitor is connected between the second switch and the second inductor.

11. The power converter as set forth in claim 10, wherein a third inductor is connected between the positive voltage source and the first switch and a fourth inductor is connected between the negative voltage source and the second switch.

12. The power converter as set forth in claim 2, wherein a first one way conductor is connected between the positive voltage source and a first intermediate node between the first switch and the output node for allowing current to only flow to the output node and a second one way conductor is connected between the negative voltage source and a second intermediate node between the second switch and the output node for allowing current to only flow from the output node.

13. The power converter as set forth in claim 12, wherein a first inductor is connected between the first intermediate node and the output node and a second inductor is connected between the second intermediate node and the output node.

14. The power converter as set forth in claim 13, wherein a first capacitor is connected between the first intermediate node and the first switch and a second capacitor is connected between the second intermediate node and the second switch.

15. The power converter as set forth in claim 14, wherein a third inductor is connected between the positive voltage source and the first switch and a fourth inductor is connected between the negative voltage source and the second switch.

16. The power converter as set forth in claim 4, wherein a third one way conductor is connected between the negative voltage source and a first intermediate node between the first inductor and the positive voltage source and a fourth one way conductor is connected between the positive voltage source and a second intermediate node between the second inductor and the negative voltage source.

17. The power converter as set forth in claim 16, wherein a third switch is connected between the first intermediate node and the positive voltage source for being opened and closed coincidentally with the first switch and a fourth switch is connected between the second intermediate node and the negative voltage source for being opened and closed coincidentally with the second switch.

18. The power converter as set forth in claim 1, and further including a capacitor connected in parallel with the load.

19. A circuit comprising:
    a pair of switches being connected between two voltage nodes and an output node common to each of the switches and adapted for being connected to a load, the voltage nodes including a first voltage node adapted for being connected to a positive voltage source and a second voltage node adapted for being connected to a negative voltage source or ground, the switches including a first switch being connected between the second voltage node and the output node and a second switch being connected between the first voltage node and the output node;
    a pair of one way conductors including a first one way conductor connected between the first switch and the output node for allowing current to only flow to the output node and a second one way conductor connected between the, second switch and the output node for allowing current to only flow from the output node; and
    a pair of inductors including a first inductor connected between the first voltage node and the first switch and a second inductor connected between the second voltage node and the second switch.

20. A method for operating a power converter including: a pair of switches being connected between two voltage nodes and an output node common to each of the switches and adapted for being connected to a load, the voltage nodes including a first voltage node adapted for being connected to a positive voltage source and a second voltage node adapted for being connected to a negative voltage source or ground, the switches including a first switch being connected between the second voltage node and the output node and a second switch being connected between the first voltage node and the output node; a pair of one way conductors including a first one way conductor connected between the first switch and the output node for allowing current to only flow to the output node and a second one way conductor connected between the second switch and the output node for allowing current to only flow from the output node; and a pair of inductors including a first inductor connected between the first voltage node and the first switch and a second inductor connected between the second voltage node and the second switch, the method comprising:
    connecting the first voltage node to the positive voltage source;
    connecting the second voltage node to the negative voltage source or ground;
    connecting a modulator to the first and second switches for opening and closing the switches; and
    modulating the first switch with a first duty cycle and modulating the second switch with a second duty cycle, wherein the first duty cycle and the second duty cycle at least partially overlap.

21. The method as set forth in claim 20, comprising: operating the power converter in a discontinuous conduction mode.

22. The method as set forth in claim 20, comprising: operating the power converter in a continuous conduction mode.

23. The method as set forth in claim 20, comprising: operating the power converter in a current controlled mode.

24. A circuit comprising:
    a pair of switches being connected between two voltage nodes and an output node common to each of the switches and adapted for being connected to a load, the voltage nodes including a first voltage node adapted for being connected to a positive voltage source and a second voltage node adapted for being connected to a negative voltage source or ground, the switches including a first switch being connected between the second voltage node and the output node and a second switch being connected between the first voltage node and the output node;
    a pair of one way conductors including a first one way conductor connected between the second voltage node and a first intermediate node between the first switch and the output node for allowing current to only flow from the output node and a second one way conductor connected between the first voltage node and a second intermediate node between the second switch and the output node for allowing current to only flow to the output node;
    a plurality of inductors including a first inductor connected between the first intermediate node and the output node, a second inductor connected between the second intermediate node and the output node, a third inductor connected between the first voltage node and the first switch, and a fourth inductor connected between the second voltage node and the second switch; and a pair of capacitors including a first capacitor connected between the first intermediate node and the first switch and a second capacitor connected between the second intermediate node and the second switch.

25. A method for operating a power converter including: a pair of switches being connected between two voltage nodes and an output node common to each of the switches and adapted for being connected to a load, the voltage nodes including a first voltage node adapted for being connected to a positive voltage source and a second voltage node adapted for being connected to a negative voltage source or ground, the switches including a first switch being connected between the second voltage node and the output node and a second switch being connected between the first voltage node and the output node; a pair of one way conductors including a first one way conductor connected between the second voltage node and a first intermediate node between the first switch and the output node for allowing current to only flow from the output node and a second one way conductor connected between the first voltage node and a second intermediate node between the second switch and the output node for allowing current to only flow to the output node; a plurality of inductors including a first inductor connected between the first intermediate node and the output node, a second inductor connected between the second intermediate node and the output node, a third inductor connected between the first voltage node and the first switch, and a fourth inductor connected between the second voltage node and the second switch; and a pair of capacitors including a first capacitor connected between the first intermediate node and the first switch and a second capacitor connected between the second intermediate node and the second switch, the method comprising:

connecting the first voltage node to the positive voltage source;

connecting the second voltage node to the negative voltage source or ground;

connecting a modulator to the first and second switches for opening and closing the switches; and modulating the first switch with a first duty cycle and modulating the second switch with a second duty cycle, wherein the first duty cycle and the second duty cycle at least partially overlap.

26. The method as set forth in claim 25, comprising:
operating the power converter in a discontinuous conduction mode.

27. The method as set forth in claim 25, comprising:
operating the power converter in a continuous conduction mode.

28. The method as set forth in claim 25, comprising:
operating the power converter in a current controlled mode.

29. A circuit comprising:

a pair of switches being connected between two voltage nodes and an output node common to each of the switches and adapted for being connected to a load, the voltage nodes including a first voltage node adapted for being connected to a positive voltage source and a second voltage node adapted for being connected to a negative voltage source or ground, the switches including a first switch being connected between the second voltage node and the output node and a second switch being connected between the first voltage node and the output node;

a pair of one way conductors including a first one way conductor connected between the first switch and the output node for allowing current to only flow to the output node and a second one way conductor connected between the second switch and the output node for allowing current to only flow from the output node;

a plurality of inductors including a first inductor connected between the first one way conductor and the second voltage node, a second inductor connected between the second one way conductor and the first voltage node, a third inductor connected between the first voltage node and the first switch, and a fourth inductor connected between the second voltage node and the second switch; and a pair of capacitors including a first capacitor connected between the first switch and the first inductor and a second capacitor connected between the second switch and the second inductor.

30. A method for operating a power converter including: a pair of switches being connected between two voltage nodes and an output node common to each of the switches and adapted for being connected to a load, the voltage nodes including a first voltage node adapted for being connected to a positive voltage source and a second voltage node adapted for being connected to a negative voltage source or ground, the switches including a first switch being connected between the second voltage node and the output node and a second switch being connected between the first voltage node and the output node; a pair of one way conductors including a first one way conductor connected between the first switch and the output node for allowing current to only flow to the output node and a second one way conductor connected between the second switch and the output node for allowing current to only flow from the output node; a plurality of inductors including a first inductor connected between the first one way conductor and the second voltage node, a second inductor connected between the second one way conductor and the first voltage node, a third inductor connected between the first voltage node and the first switch, and a fourth inductor connected between the second voltage node and the second switch; and a pair of capacitors including a first capacitor connected between the first switch and the first inductor and a second capacitor connected between the second switch and the second inductor, the method comprising:

connecting the first voltage node to the positive voltage source;

connecting the second voltage node to the negative voltage source or ground;

connecting a modulator to the first and second switches for opening and closing the switches; and modulating the first switch with a first duty cycle and modulating the second switch with a second duty cycle, wherein the first duty cycle and the second duty cycle at least partially overlap.

31. The method as set forth in claim 30, comprising:
operating the power converter in a discontinuous conduction mode.

32. The method as set forth in claim 30, comprising:
operating the power converter in a continuous conduction mode.

33. The method as set forth in claim 30, comprising:
operating the power converter in a current controlled mode.

34. A circuit comprising:
a pair of switches being connected between two voltage nodes and an output node common to each of the switches and adapted for being connected to a load, the voltage nodes including a first voltage node adapted for being connected to a positive voltage source and a second voltage node adapted for being connected to a negative voltage source or ground, the switches including a first switch being connected between the second voltage node and the output node and a second switch being connected between the first voltage node and the output node;

a pair of one way conductors including a first one way conductor connected between the first voltage node and a first intermediate node between the first switch and the output node for allowing current to only flow to the output node and a second one way conductor connected between the second voltage node and a second intermediate node between the second switch and the output node for allowing current to only flow from the output node;

a plurality of inductors including a first inductor connected between the first intermediate node and the output node, a second inductor connected between the second intermediate node and the output node, a third inductor connected between the first voltage node and the first switch, and a fourth inductor connected between the second voltage node and the second switch; and a pair of capacitors including a first capacitor connected between the first intermediate node and the first switch and a second capacitor connected between the second intermediate node and the second switch.

35. A method for operating a power converter including: a pair of switches being connected between two voltage nodes and an output node common to each of the switches and adapted for being connected to a load, the voltage nodes including a first voltage node adapted for being connected to a positive voltage source and a second voltage node adapted for being connected to a negative voltage source or ground, the switches including a first switch being connected between the second voltage node and the output node and a second switch being connected between the first voltage node and the output node; a pair of one way conductors including a first one way conductor connected between the first voltage node and a first intermediate node between the first switch and the output node for allowing current to only flow to the output node and a second one way conductor connected between the second voltage node and a second intermediate node between the second switch and the output node for allowing current to only flow from the output node; a plurality of inductors including a first inductor connected between the first intermediate node and the output node, a second inductor connected between the second intermediate node and the output node, a third inductor connected between the first voltage node and the first switch, and a fourth inductor connected between the second voltage node and the second switch; and a pair of capacitors including a first capacitor connected between the first intermediate node and the first switch and a second capacitor connected between the second intermediate node and the second switch, the method comprising:

connecting the first voltage node to the positive voltage source;

connecting the second voltage node to the negative voltage source or ground;

connecting a modulator to the first and second switches for opening and closing the switches; and modulating the first switch with a first duty cycle and modulating the second switch with a second duty cycle, wherein the first duty cycle and the second duty cycle at least partially overlap.

36. The method as set forth in claim 35, comprising:

operating the power converter in a discontinuous conduction mode.

37. The method as set forth in claim 35, comprising:

operating the power converter in a continuous conduction mode.

38. The method as set forth in claim 35, comprising:

operating the power converter in a current controlled mode.

39. A circuit comprising:

a first pair of switches being connected between two voltage nodes and an output node common to each of the switches and adapted for being connected to a load, the voltage nodes including a first voltage node adapted for being connected to a positive voltage source and a second voltage node adapted for being connected to a negative voltage source or ground, the switches including a first switch being connected between the second voltage node and the output node and a second switch being connected between the first voltage node and the output node;

a pair of one way conductors including a first one way conductor connected between the first switch and the output node for allowing current to only flow to the output node and a second one way conductor connected between the second switch and the output node for allowing current to only flow from the output node;

a pair of inductors including a first inductor connected between the first voltage node and the first switch and a second inductor connected between the second voltage node and the second switch;

a second pair of one way conductors including a third one way conductor connected between the second voltage node and a first intermediate node between the first inductor and the first voltage node and a fourth one way conductor connected between the first voltage node and a second intermediate node between the second inductor and the second voltage node; and a second pair of switches including a third switch connected between the first intermediate node and the first voltage node for being opened and closed coincidentally with the first switch and a fourth switch connected between the second intermediate node and the second voltage node for being opened and closed coincidentally with the second switch.

40. A method for controlling a power converter including: a first pair of switches being-connected between two voltage nodes and an output node common to each of the switches and adapted for being connected to a load, the voltage nodes including a first voltage node adapted for being connected to a positive voltage source and a second voltage node adapted for being connected to a negative voltage source or ground, the switches including a first switch being connected between the second voltage node and the output node and a second switch being connected between the first voltage node and the output node; a pair of one way conductors including a first one way conductor connected between the first switch and the output node for allowing current to only flow to the output node and a second one way conductor connected between the second switch and the output node for allowing current to only flow from the output node; a pair of inductors including a first inductor connected between the first voltage node and the first switch and a second inductor connected between the second voltage node and the second switch; a second pair of one way conductors including a third one way conductor connected between the second voltage node and a first intermediate node between the first inductor and the first voltage node and a fourth one way conductor connected between the first voltage node and a second intermediate node between the second inductor and the second voltage node; and a second pair of switches including a third switch connected between the first intermediate node and the first voltage node for being opened and closed coincidentally with the first switch and a fourth switch connected between the second intermediate node and the second voltage node for being opened and closed coincidentally with the second switch, the method comprising:

connecting the first voltage node to the positive voltage source;

connecting the second voltage node to the negative voltage source or ground;

connecting a modulator to the first and second switches for opening and closing the switches; and modulating the first switch with a first duty cycle and modulating the second switch with a second duty cycle, wherein the first duty cycle and the second duty cycle at least partially overlap.

41. The method as set forth in claim 40, comprising:

operating the power converter in a discontinuous conduction mode.

42. The method as set forth in claim 40, comprising:

operating the power converter in a continuous conduction mode.

43. The method as set forth in claim 40, comprising:

operating the power converter in a current controlled mode.

* * * * *

UNITED STATES PATENT AND TRADEMARK OFFICE
CERTIFICATE OF CORRECTION

PATENT NO. : 6,094,035
DATED : July 25, 2000
INVENTOR(S) : Douglas L. Smith & Robert St. Pierre It is certified that error appears in the above-identified patent and that said Letters Patent is hereby corrected as shown below:

Column 4,
Line 6, reads:
"tion has been set forth, various other parameters may be"
It should read:
-- tion has been set forth, various other parameters may be --;

Column 9,
Line 60, reads:
"between the, second switch and the output node for"
It should read:
-- between the second switch and the output node for --.

Signed and Sealed this

Fifth Day of March, 2002

Attest:

Attesting Officer

JAMES E. ROGAN
Director of the United States Patent and Trademark Office